United States Patent
Buer et al.

(10) Patent No.: US 6,867,651 B2
(45) Date of Patent: Mar. 15, 2005

(54) MMIC DRIVER AMPLIFIER HAVING ZIG-ZAG RF SIGNAL FLOW

(75) Inventors: Kenneth V. Buer, Gilbert, AZ (US); Deborah S. Dendy, Tempe, AZ (US); Gaurav Menon, Gilbert, AZ (US)

(73) Assignee: U.S. Monolithics, LLC, Chandler, AZ (US)

( * ) Notice: Subject to any disclaimer, the term of this patent is extended or adjusted under 35 U.S.C. 154(b) by 0 days.

(21) Appl. No.: 10/701,010

(22) Filed: Nov. 3, 2003

(65) Prior Publication Data

US 2004/0145418 A1 Jul. 29, 2004

Related U.S. Application Data

(63) Continuation-in-part of application No. 10/118,277, filed on Apr. 8, 2002, now Pat. No. 6,664,855.
(60) Provisional application No. 60/295,628, filed on Jun. 4, 2001.

(51) Int. Cl.[7] .............................. H03F 3/60; H03F 3/16; H03F 3/14; H03F 3/04
(52) U.S. Cl. ........................ 330/286; 330/277; 330/307; 330/311
(58) Field of Search ................................. 330/286, 277, 330/307, 311

(56) References Cited

U.S. PATENT DOCUMENTS

| | | |
|---|---|---|
| 5,008,633 A | 4/1991 | Hom |
| 5,023,677 A | 6/1991 | Truitt |
| 5,519,358 A | 5/1996 | Tserng |
| 5,659,267 A | 8/1997 | Buer et al. |
| 5,821,827 A | 10/1998 | Mowinkel et al. |
| 5,952,886 A | 9/1999 | Buer et al. |
| 5,983,089 A | 11/1999 | Mohwinkel et al. |
| 6,362,689 B1 | 3/2002 | Buer |

FOREIGN PATENT DOCUMENTS

WO    WO 01/24271 A1    4/2001

*Primary Examiner*—Patricia Nguyen
(74) *Attorney, Agent, or Firm*—Snell & Wilmer L.L.P.

(57) ABSTRACT

A MMIC (microwave monolithic integrated circuit) driver amplifier having a zig-zag RF signal flow and method for the same is provided. A smaller die size and higher output gain are realized with the improved amplification stage geometry provided herein. In particular, the stages are configured in a "stacked" topology permitting a zig-zag RF signal flow through the stages. Additionally, the DC bias circuitry may be centralized and adjacent stages may share vias. In particular, transistors, such as FETs (field effect transistors) are displaced from a conventional FET geometry with alternating FETs being rotated in opposite directions. The inputs (gate pads) and outputs (drain pads) of two adjacent FETs may be "shared." In a shared input configuration, a compensation network may be coupled to the input. The improved amplifier configuration provides a multi-sectional configuration wherein one section may be the mirrored image of another. In a two section amplifier, the amplifier appears to be "folded."

20 Claims, 11 Drawing Sheets

MMIC DRIVER AMPLIFIER HAVING ZIG-ZAG RF SIGNAL FLOW

CROSS REFERENCE TO RELATED APPLICATIONS

This application includes subject matter which is a continuation in part of and claims priority from U.S. patent application Ser. No. 10/118,277 filed on Apr. 8, 2002, now U.S. Pat. No. 6,664,855 which claims priority from U.S. Provisional Patent Application Ser. No. 60/295,628 filed on Jun. 4, 2001.

FIELD OF INVENTION

The invention relates generally to a system and method for RF signal amplification and, in particular, to a Monolithic microwave integrated circuit (MMIC) power amplifier. More particularly, the invention relates to a system and method for a MMIC power amplifier having a zig-zag RF signal flow.

BACKGROUND OF THE INVENTION

Monolithic microwave integrated circuit (MMIC) amplifiers are typically used to amplify high frequency RF and/or microwave signals. Increasing the RF gain (or amplification) in amplifiers, such as MMIC driver/power amplifiers, typically requires increasing the number of amplification stages, which is accomplished by increasing the number of transistors. Unfortunately, there is generally a sharp correlation between increasing the amplification and the design cost. This is due largely in part because as the amplification increases, the space needed on the die for amplification also increases and therefore the size of the die must also increase. Thus, it would be desirable to increase the signal amplification in a driver amplifier without causing an increase in the size of the die.

Accordingly, there exists a need for a driver amplifier with a reduced die size. In addition, there is a need for a low cost driver amplifier. Further, there is a need for improved performance driver amplifiers having higher gain and increased efficiency.

Various attempts have been proposed to reduce the die size of power amplifiers, such as that disclosed by Buer et al., U.S. Pat. No. 6,388,528. Buer proposes a "folded field effect transistor (FET)" configuration to pack the transistors into a compact area. Buer also discloses a power splitting/power combining configuration reducing the die area.

SUMMARY OF THE INVENTION

A system and method for driver amplification is provided having a plurality of amplification stages arranged on a die to permit an RF signal flow from one stage to the next with the signal flow being characteristic of a zig-zag pattern. Additionally, the driver amplifier has a DC bias circuitry centralized on the die and provides a bias feed to each of the stages.

In another embodiment, a driver amplifier of the invention includes amplification stages arranged in a stacked configuration so that adjacent stages are orientated in opposite directions.

In yet another embodiment, a driver amplifier of the invention includes an interstage matching network comprising a DC bias feed from the DC bias circuitry and a DC blocking capacitor.

In still another embodiment, a driver amplifier of the invention includes sharing source vias between at least two of the stages.

More particularly, exemplary embodiments of the present invention provide a MMIC power amplifier with a folded configuration, improved performance, reduced number of combined circuits, and reduced die size.

In accordance with one embodiment of the present invention, a microwave power amplifier includes a plurality of FETs in a folded configuration having shared inputs and outputs.

In accordance with another embodiment of the present invention, a microwave power amplifier includes a plurality of FETs arranged to form one or more sections. Multiple sections are arranged in a folded amplifier configuration.

A method of manufacturing a driver amplifier includes arranging a plurality of amplification stages on a die such that an RF signal flows through the stages in a substantially zig-zag pattern. Additionally, DC bias circuitry is arranged on a perimeter of the die and transmission lines are routed between the DC bias circuitry and each of the stages. The transmission lines may be modified to provide signal matching between the stages.

BRIEF DESCRIPTION OF THE DRAWINGS

These and other features, aspects and advantages of the present invention will become better understood with reference to the following description, appending claims, and accompanying drawings where:

DETAILED DESCRIPTION OF EXEMPLARY EMBODIMENTS

The invention provides a MMIC driver amplifier system and method having an improved amplifier stage geometry and signal flow. In particular, the invention provides a MMIC driver amplifier with a reduced die size, an increased gain and a reduced number of components. More particularly, a MMIC driver amplifier system and method of the invention provides a compact die size by, for example, configuring the amplification stages to permit a zig-zag RF signal flow, centralizing the bias circuitry, eliminating additional components for interstage matching, and possibly providing shared vias between stages.

The subject matter of the invention is particularly suited for use in connection with K band driver and medium power amplifiers. Reference may also be made to a FET (field effect transistor) driver amplifier; however, it should be appreciated and understood by one skilled in the art that various other transistors such as bipolar junction transistors (BJTs), Pseudomorphic High Electron Mobility Transistors (PHEMTs), and heterojunction bipolar transistors (HBTs), and other frequencies may appropriately be used in the invention. The following descriptions are not intended as a limitation on the use or applicability of the invention, but instead are provided merely to enable a full and complete description of a preferred embodiment.

Figure 1:
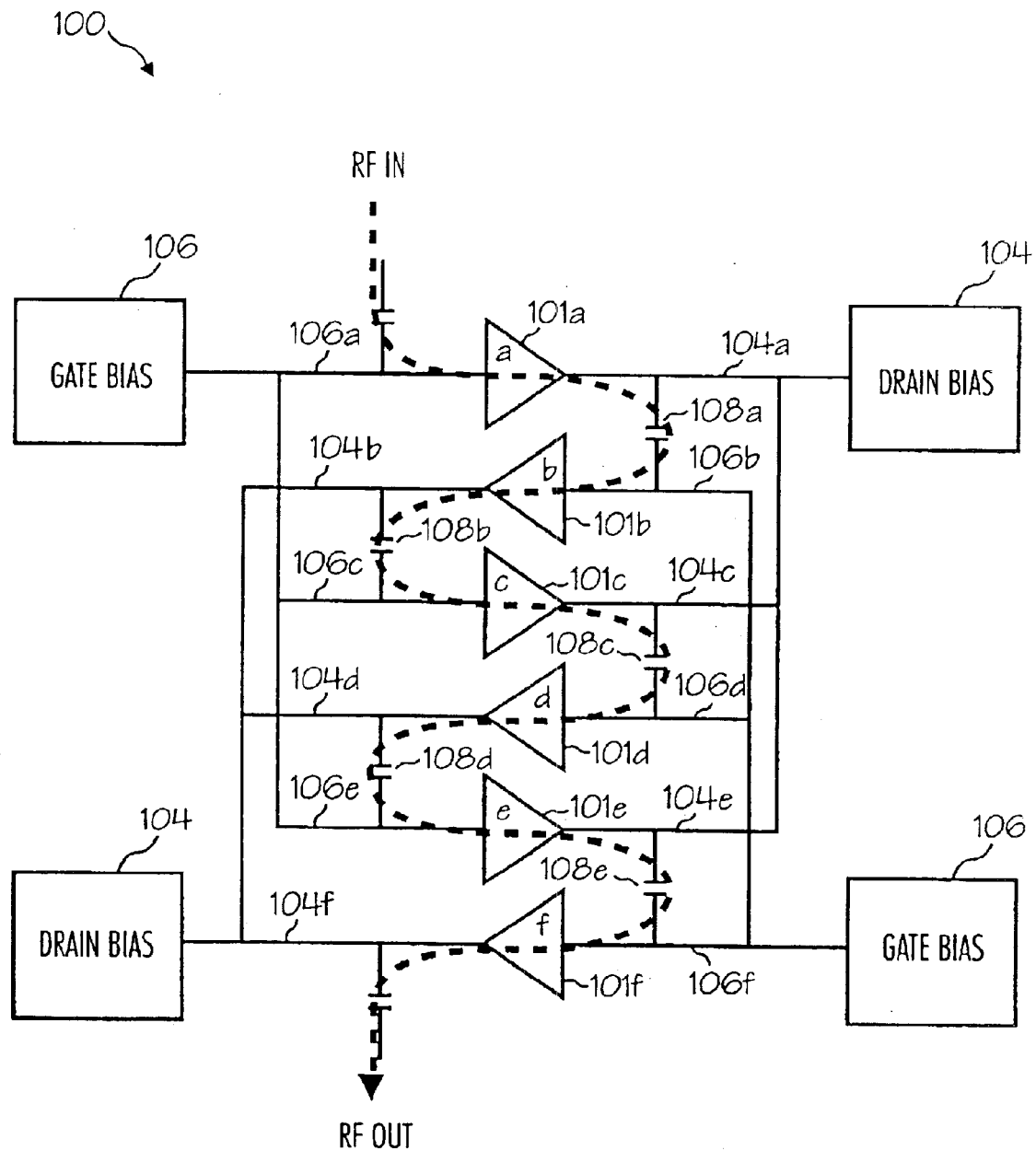
FIG. 1 illustrates, in block format, a MMIC driver amplifier in accordance with one embodiment of the invention.

FIG. 1 illustrates, in block format, an exemplary layout of a MMIC driver amplifier 100 in accordance with one embodiment of the invention. MMIC driver amplifier 100 includes six stages of amplification 101a–101f which may include FETs, HBTs, or any other suitable active device for the frequency of operation (the active devices are not shown in the present Figure). It should be appreciated that the number of stages, as well as the number of FETs making up each stage can vary depending upon the power drive needed for a particular application.

The unique zig-zag signal flow through the amplification stages of amplifier 100 is represented on FIG. 1 with a dashed line. Although not explicitly identified in the Figure, each amplification stage of amplifier 100 includes a suitable RF signal input and output. In operation, a RF signal is supplied to the input of the first stage of amplification, 101a, and then routed from 101a to second stage 101b, and so on, until the RF signal has passed through the last amplification stage (which is stage 101f on FIG. 1). Due to the placement of the stages in relation to each other, the RF signal flow appears as a zig-zag or S-shaped winding pattern through the amplifier. In this manner, the present embodiment configures adjacent stages in a "stacked" configuration, and the input of one stage is in close proximity to the output of the next stage. It should be appreciated that various other configurations may also be used to cause a similar zig-zag signal flow. For example, in various embodiments, the RF signal flows in a zig-zag pattern through a portion of the amplifier.

MMIC driver amplifier 100 of the invention further includes DC bias circuitry 104 and 106, the structure and operation of which are well known and therefore will not be discussed herein. The configuration of the amplification stages of the invention allows the bias circuitry to be located in an organized manner away from the stages. For example, bias circuitry 104, 106 may be suitably located on the perimeter of the chip with transmission lines leading to the stages. The placement of the DC components and circuitry in relation to the RF components, as well as on the chip, may offer several advantages such as, DC and RF signal separation, easy supply of bias to the perimeter of the chip, and the minimization of the number of needed components and circuitry by grouping DC components.

Leading from bias circuitry 104 and 106 are trace lines to each of the amplification stages. Each stage receives gate bias and drain bias (or the equivalent if FETs are not used) from gate bias circuitry 104 and drain bias circuitry 106, respectively. The present embodiment includes six stages, 101a–101f and, therefore, includes a gate bias feed 106a–106f and drain bias feed 104a–104f for each stage. Additionally, a capacitor 108a–108e is placed between each of the stages to, among other reasons, provide DC blocking.

As already mentioned, on-chip placement of the RF and DC components in accordance with the invention, helps to reduce the overall size of the chip. Additionally, the interstage matching network of the invention helps to further reduce the number of needed components and reduce the size of the chip. With continued reference to FIG. 1, a three element matching network (shunt L-series C-shunt L) permits impedance matching between the stages without requiring additional elements. For example, drain bias feed 104a may be suitably tuned to be a shunt RF tuning element (i.e., shunt L), capacitance 108a may be tuned to be a series capacitance (i.e., series C), and gate bias feed 106b may be tuned to be a shunt RF tuning element (i.e., shunt L). In this manner, adjustment to the "already in place" components and/or transmission lines enables interstage matching without sacrificing valuable chip space or amplifier performance. Those of skill in the industry are generally familiar with the various techniques for signal matching (e.g., determining specific component values and the computation involved) and, therefore these techniques will not be discussed herein.

Figure 2:
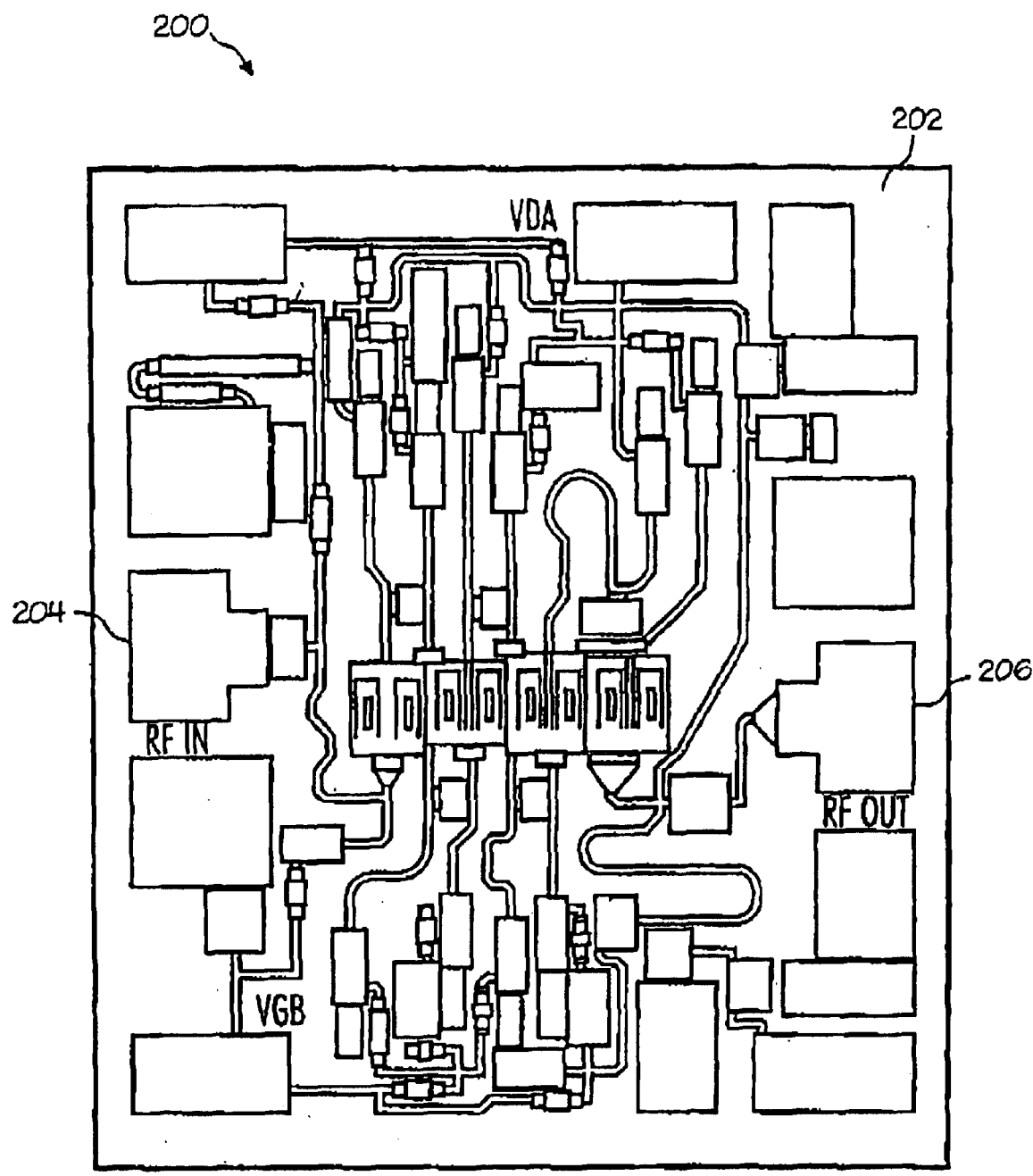
FIGS. 2 and 3 illustrate MMIC driver amplifier layouts in accordance with various embodiments of the invention.

Referring now to FIG. 2, a MMIC layout of a driver amplifier 200 in accordance with one embodiment of the invention is illustrated. An RF signal at an input port 204 of driver amplifier 200 is amplified by the multiple FET stages. The output of the final amplification stage is provided at an output port 206. The chip topology of the invention can be seen in the present embodiment, such as the stacked stage configuration and the centralized DC bias circuitry.

Driver amplifier 200 may be fabricated on any suitable MMIC substrate (i.e., chip, die) 202 of a suitable semiconductor material such as silicon (Si), gallium arsenide (GaAs), germanium (Ge), indium phosphide (InP), and combinations such as mixed silicon and germanium, mixed silicon and carbon, and the like.

As previously stated, the topology of the invention reduces the overall size of the MMIC. Exemplary driver amplifier 200 may include, for example, a six stage Ka-band frequency MMIC amplifier having a gain of about 30 dB and a die size of approximately 1.5 mm$^2$ (1.15 mm×1.3 mm). In contrast, a conventional three stage 30 GHz MMIC amplifier having a gain of about 16–18 dB requires a die size of approximately 3.42 mm$^2$ (2.85 mm×1.2 mm). Thus, the MMIC amplifier in accordance with the systems and methods of the invention has about a 56% reduced size over the conventional MMIC amplifier while increasing the number of amplification stages and the gain.

It should be appreciated that the number of amplification stages and/or number of FET fingers in each stage can vary depending upon the power needs of the particular application. As shown, exemplary driver amplifier 200 includes six stages with each FET having two fingers, except the last FET having four fingers.

Additional features of the present embodiment, in accordance with the invention, include sharing vias between some or all of the stages. For example, due in part to the stacked configuration of the stages as previously described, the source vias of each stage may be combined. One skilled in the industry can readily recognize that by combining vias, the number of needed vias can be reduced. Hence, using the topology of the invention, the number of vias may be reduced by about 50%, helping to reduce the overall chip size and to maintain the chip integrity.

The reduced die size of the invention provides easier handling and assembly of the die. Additionally, smaller die area decreases the probability of random die defects within the die itself and reduces the chance of solder voids in the attachment process. Moreover, the topology of the invention (e.g., stacked stages and centralized DC circuitry) lends itself to a substantially square chip which helps to improve yields by reducing stress points. The relatively thin 2-mil die (i.e., 50 μm) is extremely susceptible to breakage, and as the die area increases, the chance of breakage increases. One skilled in the art will readily recognize the benefits of the reduced die size provided by the invention including, but not limited to, the improved production yield when using a thin die. Some of the advantages of the invention are herein described with respect to a 2-mil die, for among the same and other reasons, it should be appreciated that the present invention is equally as advantageous for other die sizes (e.g., 1-mil, 4-mil, 8-mil, and the like).

Figure 3:
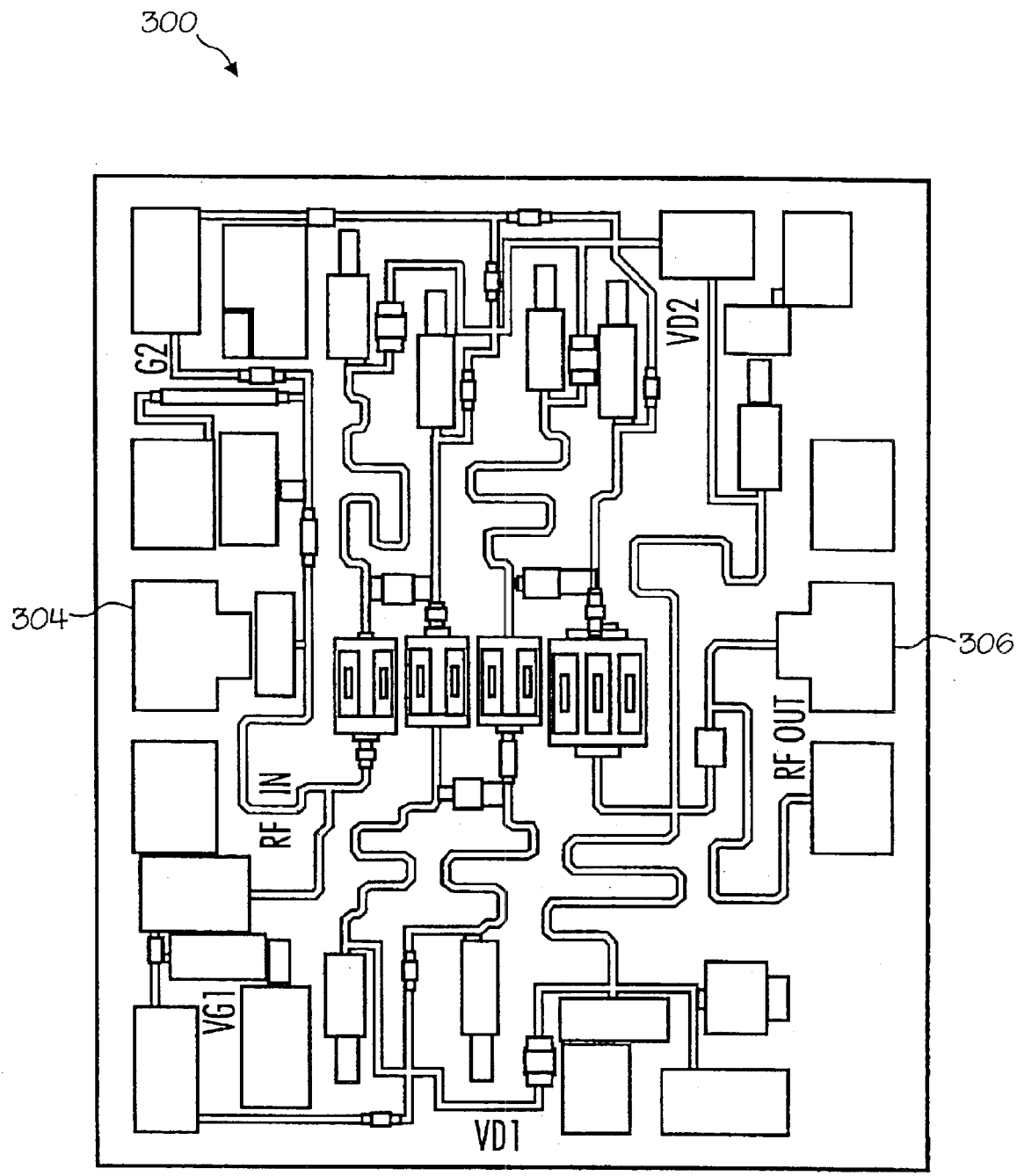

FIG. 3 illustrates a MMIC driver amplifier 300 layout in accordance with another embodiment of the invention. An RF signal at an input port 304 of driver amplifier 300 is amplified by the multiple FET stages, with the output of the final amplification stage provided at an output port 306. Driver amplifier 300 includes a similar topology as the previous embodiments (i.e., stacked stage configuration, zig-zag RF signal flow, and centralized DC components), except that driver amplifier 300 is a four stage, 30 dB gain, Ku-band frequency MMIC amplifier. In this embodiment, vias may not be shared because the number of stages has been decreased. However, it should be realized that in another embodiment the vias of adjacent stages may be shared.

Furthermore, the present invention relates to an improved power amplifier and more particularly, to an improved monolithic microwave integrated circuit (MMIC) power amplifier. Although the power amplifier disclosed herein may be suitable for mobile communication in a variety of applications, the present invention may be conveniently described with reference to commercial satellites systems or terrestrial point to multi-point communication systems, and more particularly to ground based Ka-band transmitters operating between about 26.5 GHz and 32 GHz. In addition, reference is made to a FET (field effect transistor) power amplifier; however, it should be appreciated and understood by one skilled in the art that various other transistors may appropriately be used in the present invention, for example, bipolar junction transistors (BJTs) and heterojunction bipolar transistors (HBTs).

Figure 4:
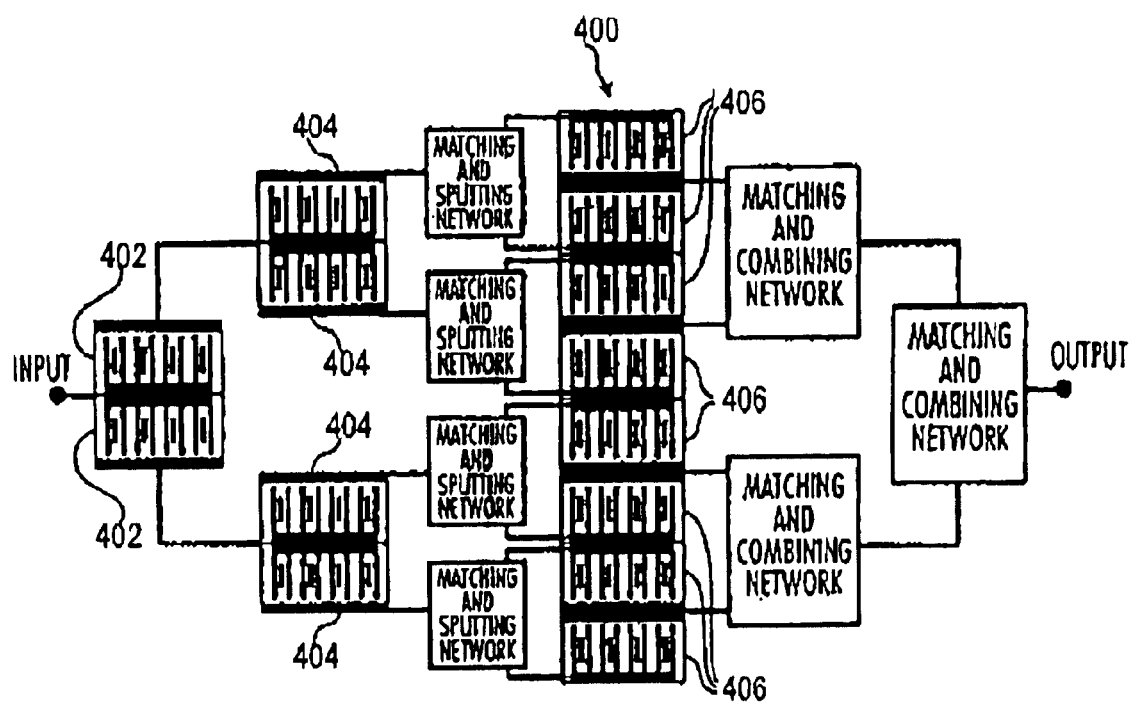
FIG. 4 illustrates a simplified layout of a MMIC power amplifier in accordance with the present invention.

FIG. 4 illustrates an exemplary layout of a MMIC power amplifier 400 in accordance with one embodiment of the present invention. MMIC power amplifier 400 includes three stages of parallel signal amplification (i.e., a 2-4-8 topology). It should be appreciated that the number of stages of amplification can vary and the number of FETs (field effect transistors) making up each stage can also vary depending upon the power drive needed for a particular application. The first stage of amplification of the present embodiment is provided by FETs 402, the second stage by FETs 404, and the third stage by FETs 406.

Figure 9A:
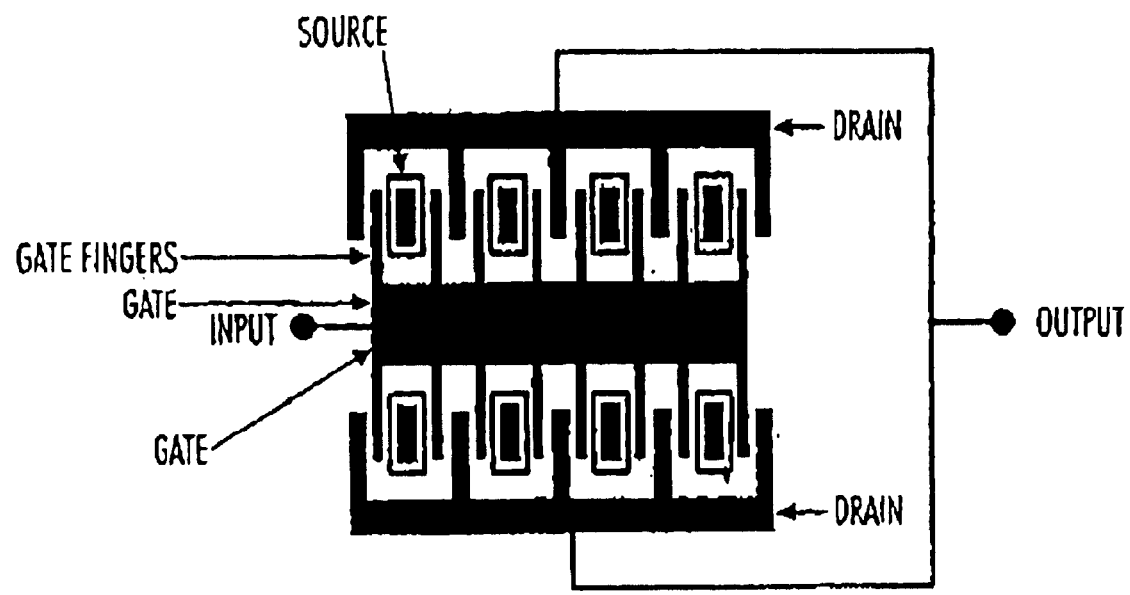
FIGS. 9A and 9B illustrate exemplary folded-FET configurations in accordance with the present invention.
Figure 9B:
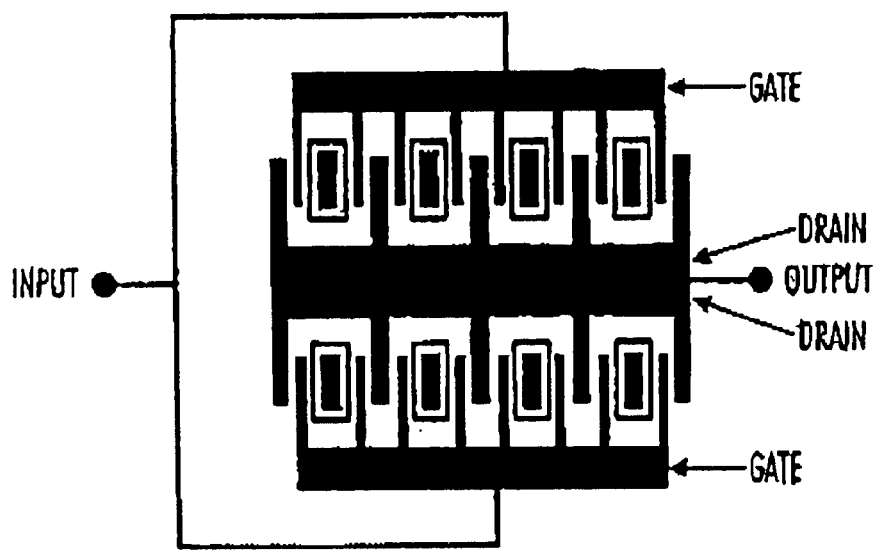

One aspect of the present invention relates to its "folded" configuration. Referring now to FIGS. 9A and 9B, two adjacent FET cells in accordance with the present invention are illustrated. Each of the unit FET cells is rotated 90° from a conventional FET cell configuration, thus the orientation of each FET appears to be "folded" with respect to the conventional orientation. The improved folded orientation of the present invention provides for a shared input and shared output at the gate and drain regions respectively for two adjacent FETs. Alternating FETs may be rotated in the opposite direction so that adjacent gates can be fed from a single point and/or adjacent drains can be power combined at the device output. The particular aspects of the shared input and output will be discussed in detail below. The improved FET geometry of the present invention provides many benefits over the prior art, for example, reduced die size, increased reliability, and improved performance, the details of which will be discussed below.

Figure 8:
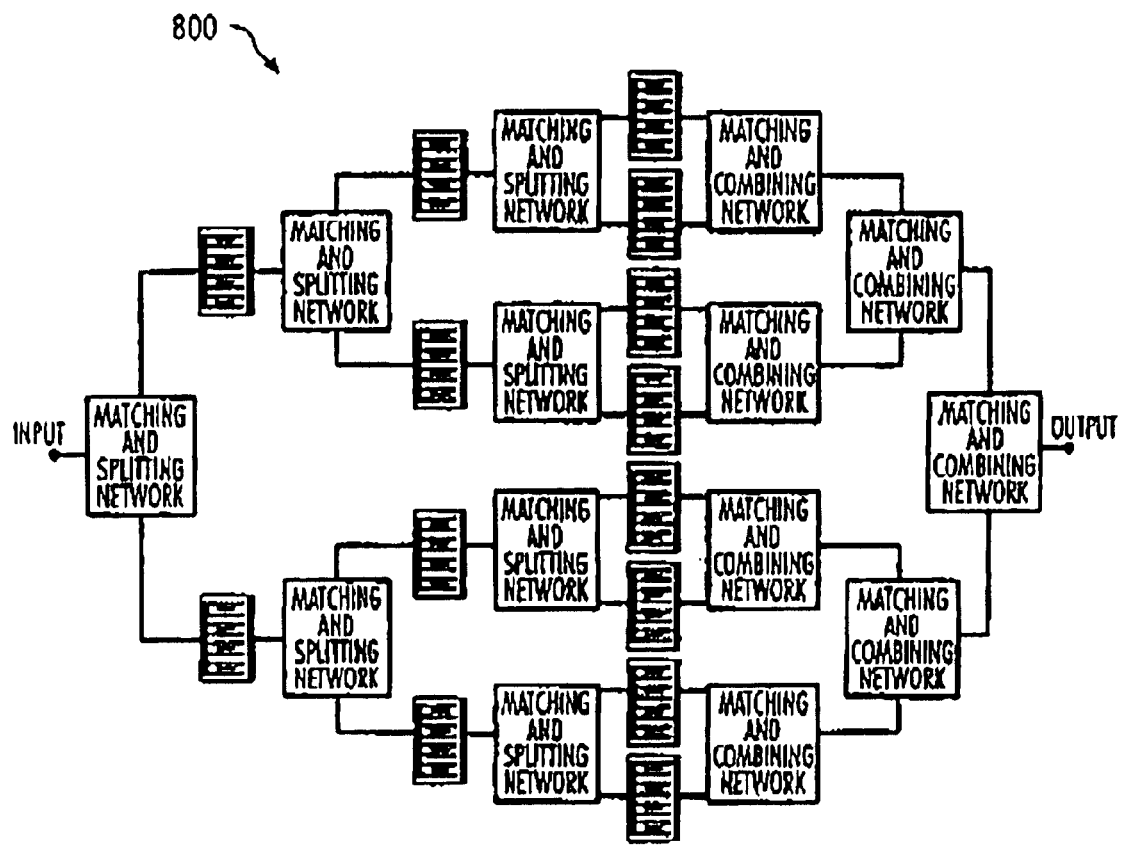
FIG. 8 illustrates a simplified conventional layout of a MMIC power amplifier of the prior art.

Referring now to FIG. 8, the layout of a prior art MIMIC power amplifier 800 is illustrated. Amplifier 800 includes a plurality of FETs placed in a conventional configuration, i.e., placed end-to-end (the gates and drains of each stage are in vertical alignment). For simplified comparison, amplifier 800 is shown in a typical three stage amplification 2-4-8 topology. In operation, the thermal effects of power amplifiers are typical of various other circuitry in the industry. More particularly, the power dissipates as the temperature increases. The heating caused by power dissipation reduces the overall power and gain of the amplifier. The heat generated by one FET can transfer and add to the heating from another FET and significantly increase the thermal problem. Due to the "end-to-end" geometry of amplifier 800, the active regions (gate fingers) are in close proximity and facilitate the mutual heating effects of two nearby devices. To alleviate the thermal effects, the configuration of amplifier 800 (and other similar prior art devices) includes a small separation (e.g., 50 $\mu$m) between each of the FETs. "Dead" space on the die, e.g., space used only to separate the FETs to reduce the thermal effects, increases the size of the die and therefore increases the cost of manufacture.

Referring again to FIGS. 9A and 9B, the folded configuration of the present invention avoids the need for "dead" space used to reduce the thermal effects. Thermal advantage is gained by separating the active regions (for example, the gate fingers) to reduce the mutual heating effects between two adjacent FETs. The present invention provides for a natural separation of about 80 to 100 $\mu$m. For example, with continued reference to FIGS. 9A and 9B, the gate and drain regions of two adjacent FETs provides sufficient separation of the active regions to reduce the heating effects. The geometry of the present invention allows the devices to run 20–30° C. cooler than conventional devices in, for example, a typical 4 watt power design. The cooler operating temperature increases the reliability and extends the expected lifetime of the MMIC power amplifier of the present invention by a factor of about four to eight times longer than a conventional MMIC power amplifier of the prior art. In addition, improved performance results from the reduced FET junction temperatures. For example, a 20–30° C. reduction in junction temperature results in the power amplifier of the present invention increasing output by about 0.4 dB and increasing gain by about 1.3 dB.

Prior art amplifier 800 includes a large number of matching and splitting/combining networks. The splitting/combining networks, as the name suggests, evenly split the input power delivered to the FETs and then combine the output power. Splitting/combining networks are common in the industry. Thus, it should be appreciated that the exact circuitry for the networks need not be discussed herein, but rather is typically an engineering design which varies with the particular topology of the amplifier. It is advantageous to match the FETs for even mode operation. As illustrated in exemplary FIG. 8, a significant amount of die area is consumed by the matching and splitting/combining networks. In fact, the layout of amplifier 800 includes more die area for matching and splitting/combining networks than for FETs.

Referring again to exemplary FIG. 4 of the present invention, the number of matching and splitting/combining networks is significantly reduced compared to the prior art MMIC power amplifier of FIG. 8. The present invention alternates two adjacent FETs in opposite directions so that alternating gate and drain interconnects may be "shared." The sharing of gate pads (input) reduces circuit area by reducing at least one level of splitting. The sharing of drain pads (output) reduces circuit area by providing one level of circuit combining at the drain of the device. The improved geometry of the present invention reduces the number of matching and splitting/combining networks by up to 50% over the prior art. Reducing the number of combiner and splitter layers reduces the space required on the die for circuitry performing this function. In addition, the reduction in combiner and splitter layers improves the performance of the power amplifier by reducing the loss associated with output combining. The improved MMIC power amplifier configuration of the present invention provides reduced numbers of matching and splitting/combining networks which results in smaller die area, higher output power and higher gain.

As previously mentioned, FIGS. 9A and 9B exemplify a shared input and a shared output respectively of a FET arrangement in accordance with the present invention. In the shared topology of the present invention, the input to two adjacent FET cells is shared at the gates of each of the FETs (FIG. 9A). The output of two adjacent FET cells is shared at the drains of each of the FETs (FIG. 9B). The "shared" configuration does not require any changes to the basic structure of the FET device. Therefore, a standard unit FET cell may be used which is well understood and characterized at high frequency for parasitic behavior.

The shared input and output further reduces power loss due to path length differences by feeding the device from one side of the FET (see e.g., FIG. 9A) and connecting the drain from the other side (see e.g., FIG. 9B). The differences in path length through center and edge fingers can limit the number of fingers available in a FET device. For example, at high frequencies, the path length differences can cause significant power loss due to vector summation at different phases. The configuration of the present invention is substantially free from path length differences, thus the number of gate fingers may be limited only by impedance matching concerns.

Figure 10:
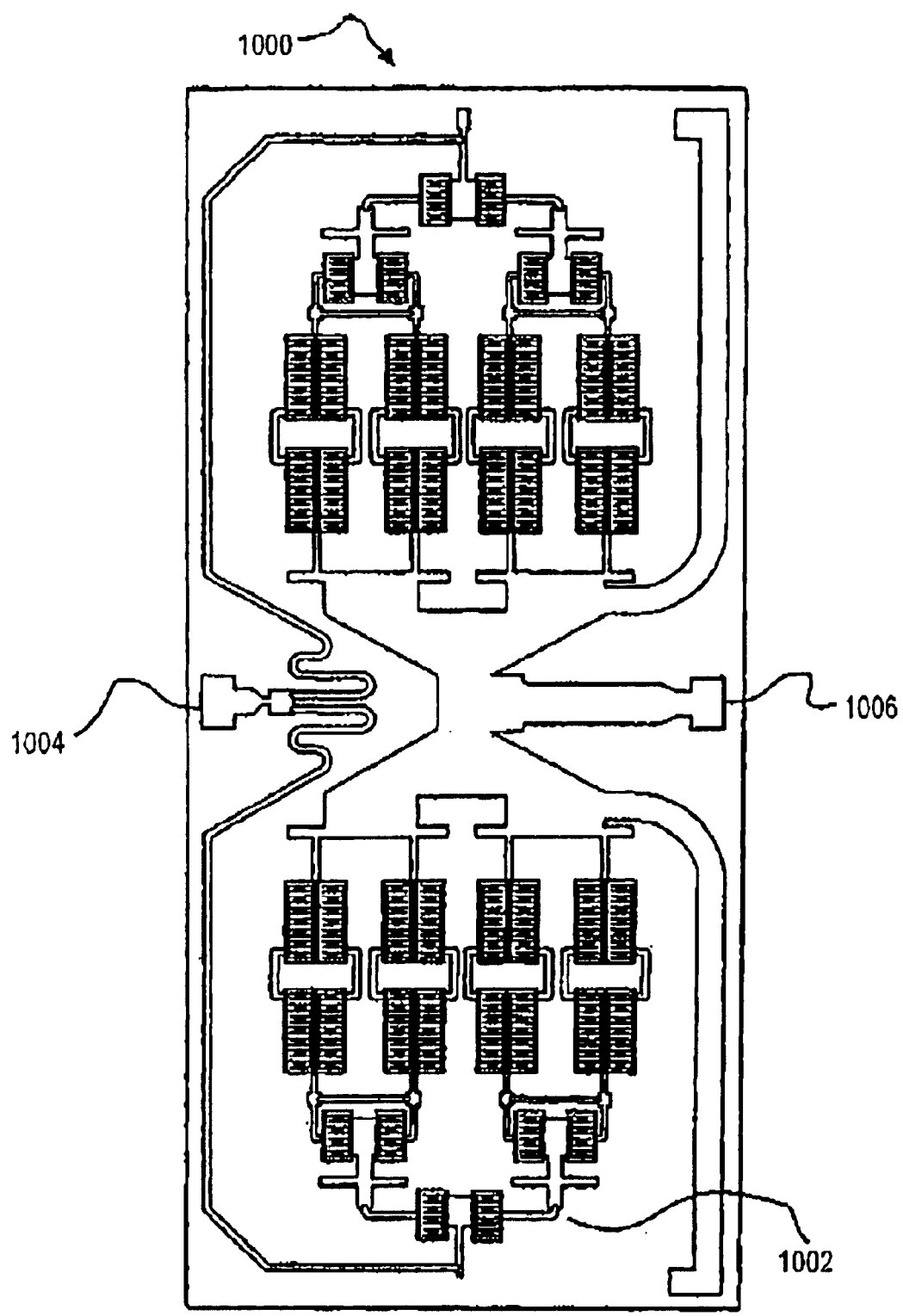

Referring now to FIG. 10, a simplified MMIC layout of a power amplifier 1000 in accordance with the present invention is illustrated. An RF signal at an input port 1004 of power amplifier 1000 is amplified by multiple FET stages. The outputs of the final stage may be combined through an output matching and combining network to provide one output signal at an output port 1006. Exemplary amplifier 1000 may, for example, include a 30 GHz input and a 4 W output power amplifier having four stages of amplification (i.e., 2-4-8-8 topology). The input RF signal is divided to provide substantially equal input power to two or more sections of the amplifier. In this embodiment, amplifier 1000 comprises two substantially equal sections of multiple FET stages. In other words, amplifier 1000 includes a section having a plurality of FETs in a staged power orientation and another section which is the mirrored image of the first section. This topology gives amplifier 1000 a "folded" amplifier appearance.

The folded configuration of the present invention also includes a folded FET configuration (e.g., as illustrated in FIGS. 9A–9B and the accompanying discussion). The improved FET configuration of the present invention provides all of the FET fingers with equal through phase resulting in improved power combining (less loss) of the FET fingers. Power Amplifier 1000 includes both a folded FET and a folded amplifier configuration.

Power amplifier 1000 may be fabricated on any suitable MMIC substrate (i.e., chip, die) 1002 of a suitable semiconductor material such as silicon (Si), gallium arsenide (GaAs), gallium nitride (GaN), germanium (Ge), indium phosphide (InP), and combinations such as mixed silicon and germanium, mixed silicon and carbon, and the like.

The embodiments shown in FIGS. 1, 9A, 9B and 4 are suitable for any microwave and millimeter frequency range. If a typical frequency around 30 GHz is chosen, the length of the MMIC chip 1000, in accordance with the present invention, is approximately 4.2 mm and the width is approximately 2.0 mm. In contrast, a conventional 30 GHz MMIC power amplifier with similar performance characteristics (e.g., amplifier 800 of FIG. 8) requires a die size of approximately 5.5 mm length and 5.5 mm width. There have been attempts at reducing the die size using various FET configurations. For example, Buer et al., U.S. Pat. No. 5,952,886, discloses a diagonally oriented FET configuration. The power amplifier of Buer et al. is fabricated on a MMIC chip with a length of 4.65 mm and a width of 3.5 mm. The MMIC power amplifier in FIG. 10, in accordance with the present invention, illustrates roughly a 48% smaller die area than Buer et al. and a 72% smaller die area than a conventional MMIC amplifier.

The reduced die size of the present invention provides easier handling and assembly of the die. For example, in the past, the relatively thin 2-mil die (i.e., 50 $\mu$m) was extremely susceptible to breakage, and as the die area increased, the chance of breakage increased. Moreover, smaller die area decreases the probability of random die defects within the die itself and reduces the chance of solder voids in the attachment process. One skilled in the art will readily recognize the benefits of the reduced die size provided by the present invention including, but not limited to, the improved production yield. Some of the advantages of the present invention are herein described with respect to a 2-mil die, for among the same and other reasons, it should be appreciated that the present invention is equally as advantageous for other die sizes (e.g., 1-mil, 4-mil, 8-mil, and the like).

Figure 5:
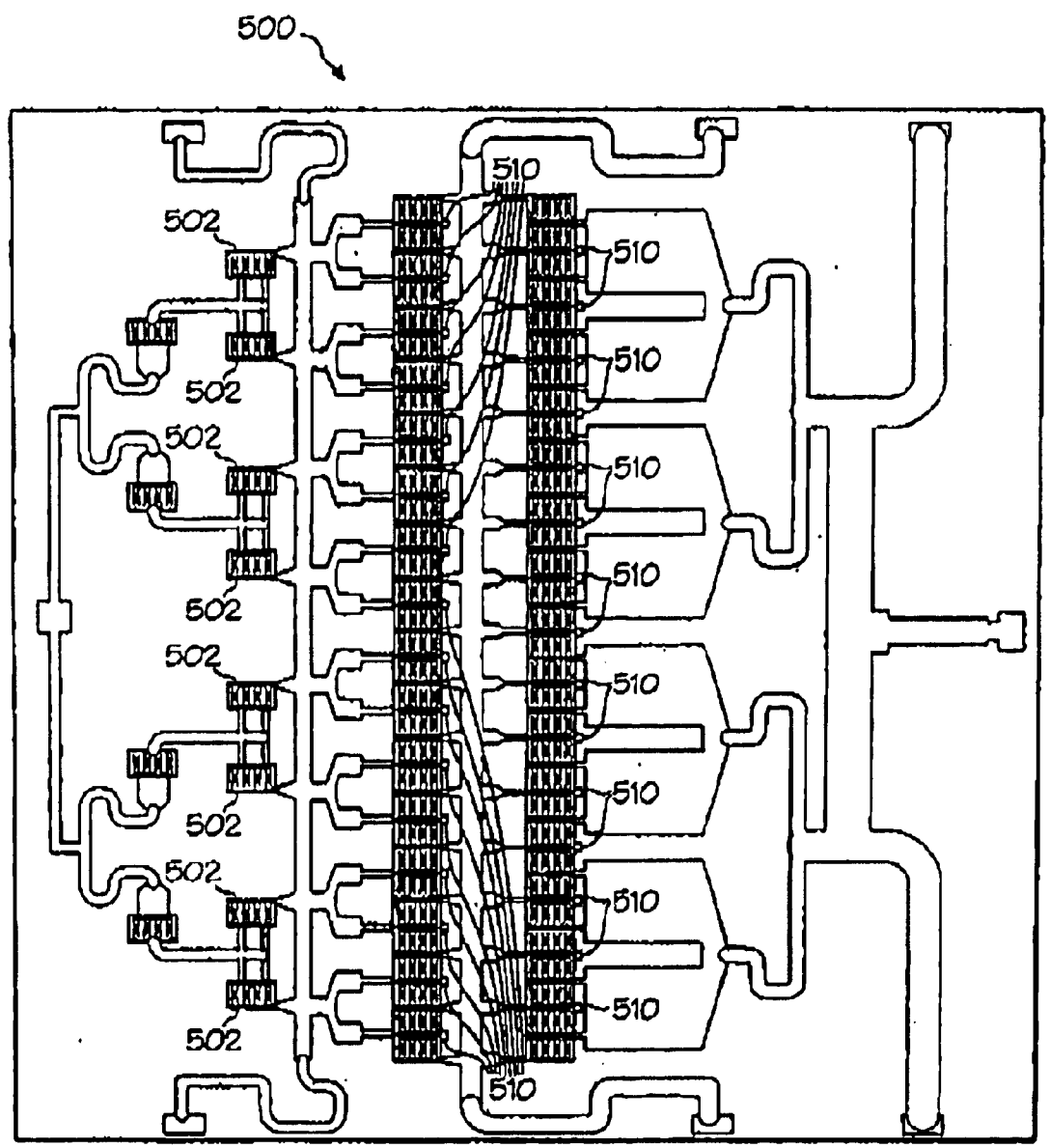
FIGS. 5, 7 and 10 illustrate circuit layouts of MMIC power amplifiers in accordance with various embodiments of the present invention.

FIG. 5 illustrates a MMIC power amplifier 500 in accordance with another embodiment of the present invention. Amplifier 500 includes a single section (i.e., no mirrored image section) comprising a four stage amplification having a 4-8-32-32 topology. As previously mentioned, the number of stages in a power amplifier can vary and is generally dependent upon the gain and frequency of the particular application. The number of transistors in each stage is generally dependent upon the level of power drive needed for the particular application. As one skilled in the art will readily recognize, amplifier 500 is a high power amplifier having an output of around 6 watts.

The second stage of amplification includes, for example, eight FETs 502 in a folded FET configuration. In this embodiment, FETs 502 do not include a shared input or shared output. The remaining two stages of amplification (32 FETs and 32 FETs) are in a folded FET configuration with both shared inputs and shared outputs in a manner previously discussed with respect to FIGS. 1–4. Thus, for some power amplification applications it may be desirable to only share some of the inputs and only some of the outputs (e.g., for FET aligning purposes).

Unlike exemplary amplifier 1000, amplifier 500 does not include a folded amp or mirrored image configuration. For many applications, it is possible to achieve the desired power amplification using only a single section of amplification devices (e.g., FETs) arranged in a staged pattern. Of course while amplifier 500 is not shown in the folded amp configuration of the present invention, it is certainly within the scope of the invention to include such a design.

As previously mentioned, the folded FET configuration of the present invention is substantially free from path length differences, thus the number of gate fingers used in the folded topology may be limited by impedance matching concerns. The design of power amplifiers generally requires combining the outputs of active devices together to achieve a higher power output than would be possible with a single device. However, combining active devices can reduce the maximum available gain, which of course is an undesirable result.

FIG. 5 further illustrates another embodiment of the present invention having a compensation network 510. Compensation network 510 is preferably configured to compensate for the reduced maximum available gain (GMAX) which typically occurs from combining active devices. As shown, exemplary MMIC 500 is a four stage amplifier with the last two stages having a compensated folded FET pair configuration in accordance with the present invention. It should be appreciated that any number of stages may be included and one or more of the stages may be implemented in a folded FET configuration of the present invention. Moreover, some or all of the folded FET pairs may be implemented as compensated FETs of the present invention and although two stages having compensated FETs are illustrated in exemplary FIG. 5, this is by no means intended to be limited. By providing compensation network 510 to the folded FET topology of the present invention, a reactive matching can be achieved to the gate fingers distanced from the input matching network to each FET pair. The result is an improved matching for the folded FET pair and power amplifier. In fact, early results demonstrate that a compensated folded FET pair of the present invention shows an improved GMAX between about 20 to 40 GHz with an approximate 8 dB GMAX around 30 GHz.

Figure 6:
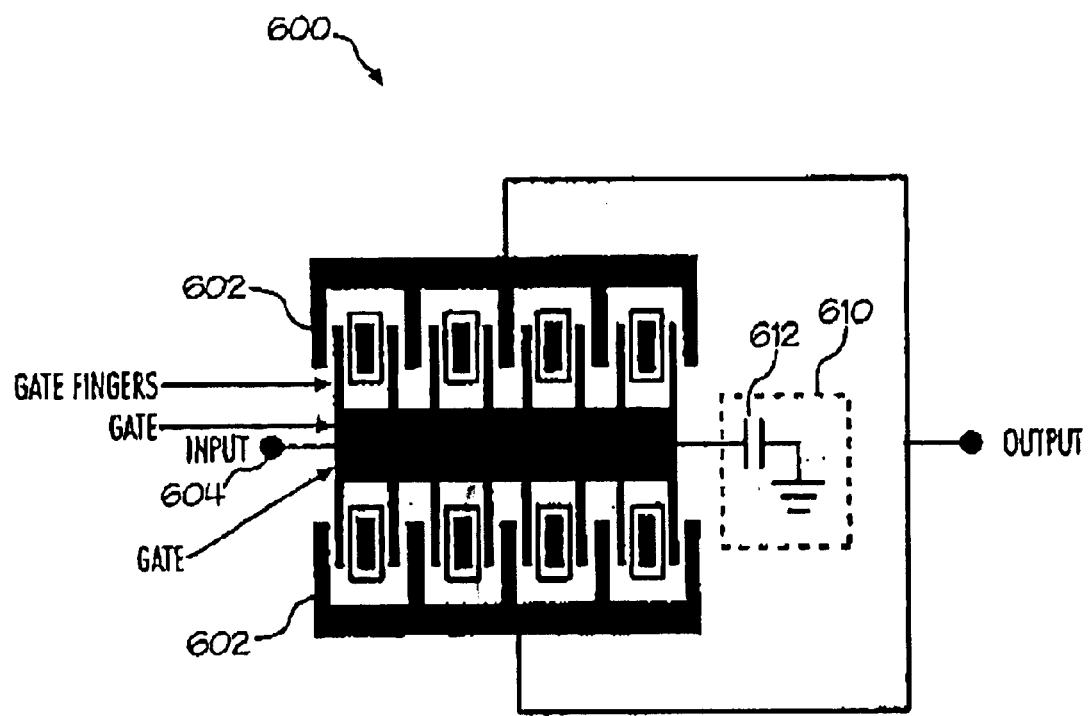
FIG. 6 illustrates a compensated folded-FET in accordance with the present invention.

FIG. 6 illustrates an exemplary compensated folded FET configuration 600 in accordance with the present invention. FETs 602 are configured as a folded FET pair having a shared input 604 coupled to a compensation network 610. Compensation network 610 may be implemented as a shunt capacitor 612. The network 610 (capacitor 612 along with any inherent inductive parasitics) provides a resonant LC matching network for distant gate fingers (i.e., gate fingers physically located a distance from the input). Additionally, network 610 may be grounded, for example to shared vias of each FET (not shown). For instance, one via may be shared between network 610 and one of the FETs and a second via may be shared between network 610 and the second FET. This "shared via" configuration helps to maintain electrical symmetry between the FETs.

Referring again to FIG. 5, power amplifier 500, in accordance with the present invention, is a 6 watt amplifier and is approximately 5.5 mm in length and 5.0 mm in width. A 4 watt amplifier of the prior art having a conventional FET configuration (e.g., FIG. 8) has approximately the same die area as exemplary 6 watt power amplifier 500. Ideally, a large number of FETs arranged in multiple stages could be included on a die to increase the power output. However, as the die size increases to accommodate the increased number of FETs, the strength of the die decreases, thereby increasing the risk of die breakage. Die areas in the range of 30 to 35 mm are generally accepted in the industry as a "safe" maximum area. Areas greater than 35 mm significantly decrease the die yield due to increased die breakage and increased probability of random die defects. The present invention can suitably be used to increase the power output of a power amplifier by 50% without jeopardizing the die yields by increasing the die size beyond an undesirable range.

Figure 7:
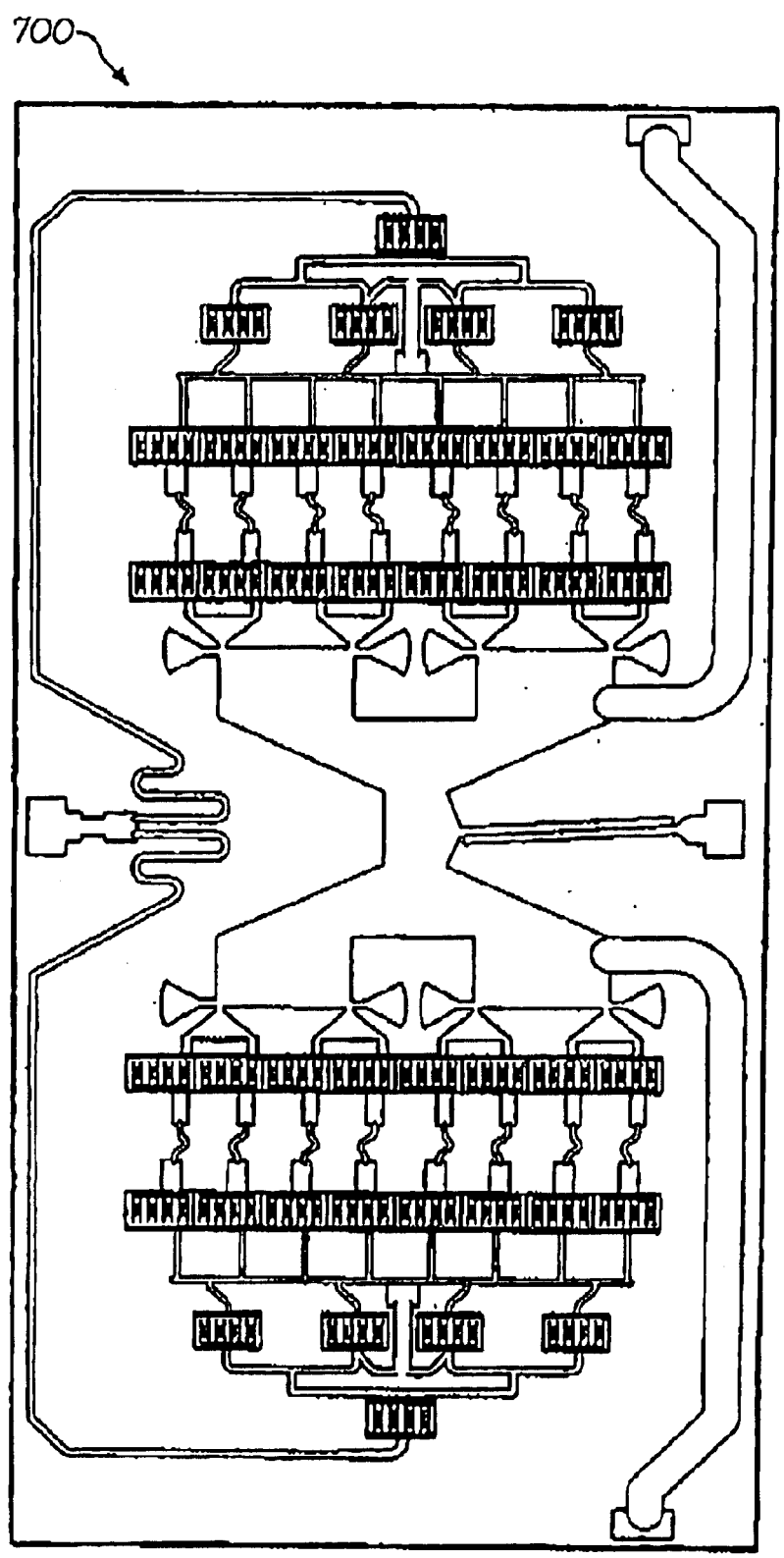

FIG. 7 illustrates a MMIC power amplifier 700 in accordance with yet another embodiment of the present invention. Amplifier 700 includes a folded amplifier configuration of the present invention similar to exemplary amplifier 1000, but unlike the previous embodiments, the FETs of amplifier 700 are not arranged in a folded FET configuration. The FETs of amplifier 700 are arranged so that the gates and drains of each stage are substantially vertically aligned (e.g., amplifier 800 of FIG. 8).

The folded amplifier configuration of FIG. 7 has a slightly larger die size than exemplary amplifier 1000, but due to the folded amplifier configuration, the size is still considerably smaller than the conventional 4 watt amplifier. For example, at an operating frequency around 30 GHz, the length of MMIC chip 700, in accordance with the present invention, is approximately 5 mm and the width is approximately 2.5 mm, which is roughly 23% smaller in die area than Buer et al. and 58% smaller in die area than the conventional MMIC configuration.

The folded amplifier configuration of FIG. 7 provides an alternative to the folded FET and folded amplifier configuration of FIG. 10, and the folded FET configuration of FIG. 5. For some applications, all of the benefits of using a smaller die may be desired, but due to bandwidth limits, e.g., matching concerns for certain sizes of FETs, it may not be practical to include a folded FET configuration. Therefore, the folded amplifier configuration of the present invention allows the FETs to be arranged in a conventional manner, such as the configuration of FIG. 8, yet includes a mirrored image section or folded appearance to reduce the overall die area.

Figure 11:
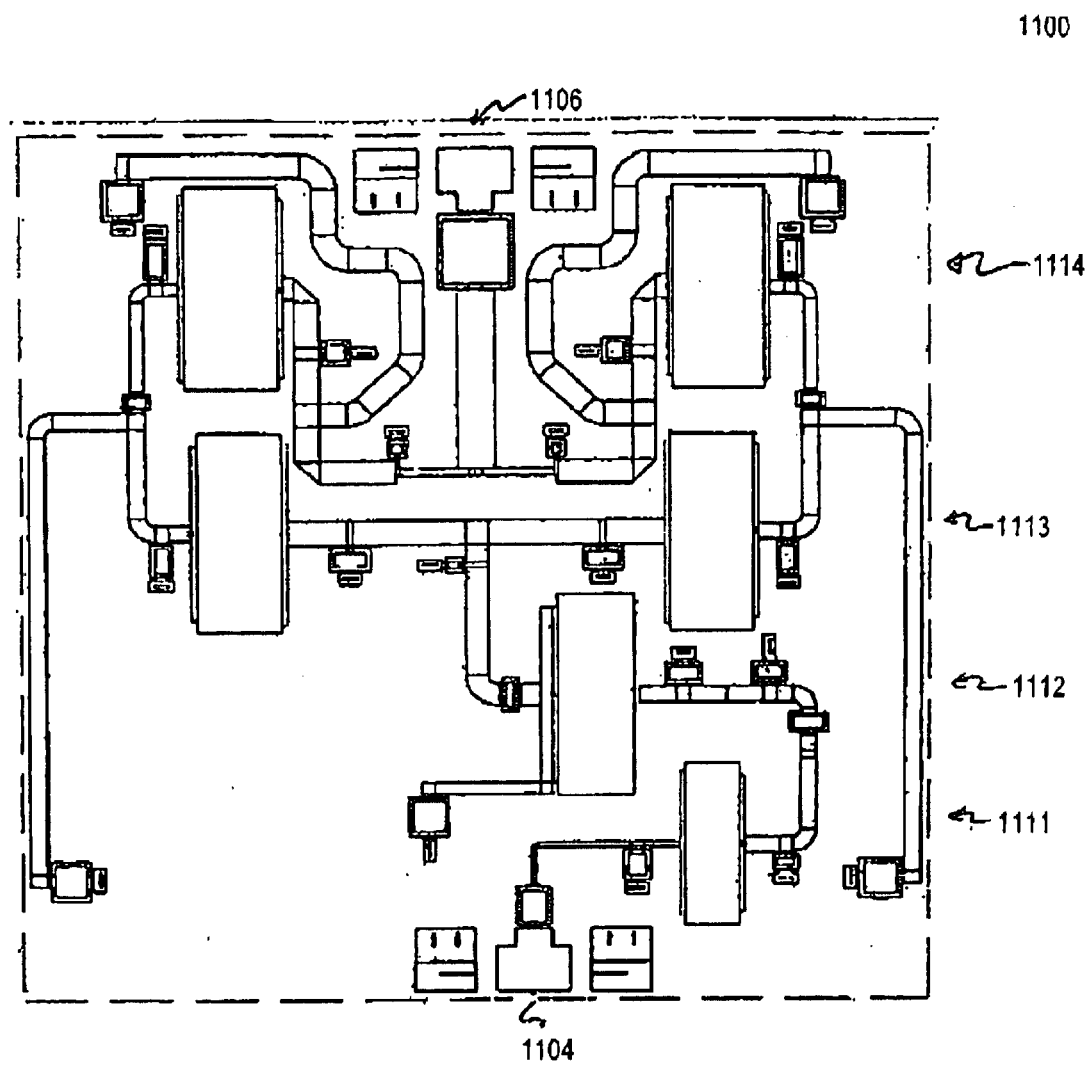
FIG. 11 illustrates an exemplary zig-zag layout of a MMIC power amplifier in accordance with the present invention.

In accordance with yet another aspect of the present invention, the zig-zag signal flow aspect may be combined with the folded FET aspect and/or the power combining/power splitting aspect as each of these aspects is described herein. For example, FIG. 11 illustrates an exemplary power amplifier 1100, having RF signal input 1104 and output 1106, where power amplifier 1100 is a four stage power amplifier having a first stage 1111, second stage 1112, third stage 1113, and fourth stage 1114. The RF signal follows a zig-zag path through the first and second stages between input 1104 and output 1106. Furthermore, power splitting occurs before third stage 1113 and power combining after fourth stage 1114. Moreover, in various embodiments, the stages may employ folded FETS. For example, stage 1111, 1112, 1113 and/or 1114 may comprise folded FETS. Although the zig-zag RF signal flow is illustrated here with only two stages, the zig-zag pattern may also involve more than two stages. Furthermore, more than one zig-zag chain may exist on an MMIC. Thus all of the zig-zag signal paths on an MMIC need not be contiguous.

In yet a further aspect of the present invention, use of zig-zag signal flow with the power splitting/combining facilitates an 'aspect ratio' that is close to 1. MMIC power amplifiers with aspect ratios of approximately 1 are generally less susceptible to breaking, have improved yield, and may facilitate efficient packaging.

It should be appreciated that the particular implementations shown and described herein are illustrative of various embodiments of the invention including its best mode, and are not intended to limit the scope of the present invention in any way. For example, the systems and methods for MMIC driver amplifiers described herein were described with respect to FETs, however various other active devices may be equally as suitable. For the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles. These and other changes or modifications are intended to be included within the scope of the present invention, as expressed in the following claims.

What is claimed is:

1. A power amplifier comprising:
a plurality of amplification stages arranged on a die to permit an RF signal flow from one stage to the next stage with said RF signal flow being characteristic of a zig-zag pattern within at least a portion of said plurality of amplification stages; and
a DC bias circuitry centralized on said die, said circuitry providing a bias feed to each of said amplification stages;
wherein the plurality of amplification stages comprise a plurality of transistors and at least some of the transistors are arranged in a folded configuration; and
wherein at least two of said plurality of amplification stages further comprise a compensation network coupled to a shared input of a transistor pair, signal splitter circuitry for providing substantially in-phase signals to the transistors; and combiner circuitry for in-phase combining outputs of the transistors.

2. The power amplifier of claim 1, wherein said RF signal flows through at least two stages in said zig-zag pattern and then flows through said signal splitter circuitry and combiner circuitry.

3. The power amplifier of claim 1, wherein said RF signal flows successively through said signal splitter circuitry, through at least two stages in said zig-zag pattern, and then through said combiner circuitry.

4. A driver amplifier comprising a plurality of amplification stages, wherein at least two of said plurality of amplification stages are oriented such that an RF signal output of one of said plurality of amplification stages faces in the same direction as an RF signal input of an adjacent amplification stage.

5. The driver amplifier of claim 4, wherein each amplification stage comprises a plurality of transistors arranged in a folded configuration.

6. A driver amplifier comprising:
a plurality of amplification stages arranged on a die to permit substantially all of an RF signal to flow from one stage to the next stage, and wherein said RF signal flow is characteristic of a zig-zag pattern; and
a DC bias circuitry centralized on said die, said circuitry providing a bias feed to each of said amplification stages.

7. The driver amplifier of claim 6, wherein said amplification stages are arranged on said die such that the input of a first stage is orientated in the opposite direction of an adjacent stage.

8. The driver amplifier of claim 7, wherein each amplification stage comprises a plurality of transistors, each having an input and an output, the transistors arranged in a folded configuration such that each of the transistors includes gate fingers with at least one of the transistors having gate fingers in vertical alignment with the gate fingers of another transistor.

9. The driver amplifier of claim 7 further comprising a plurality of sections with each section having a plurality of FETs, said FETs arranged on a die in a folded FET configuration such that there is a shared gate connection of at least two of the FETs and a gate and a drain of at least two FETs are in vertical alignment, said sections arranged on a die in a folded amp configuration such that at least two of said sections represent mirrored images of each other.

10. The driver amplifier of claim 7 configured in a folded amplifier configuration.

11. A MMIC driver amplifier comprising:
a plurality of FET amplification stages with each stage having an RF signal input and an RF signal output, wherein at least two adjacent stages are orientated in opposite directions so that the output of one of said plurality of FET amplification stages is physically oriented in the opposite direction of the output of an adjacent one of said plurality of FET amplification stages;
a DC bias circuitry centralized on said die, said circuitry providing a bias feed to each of said amplification stages; and
an interstage matching network comprising said bias feed and a DC blocking capacitor.

12. The MMIC driver amplifier of claim 11 configured to operate in one of the following band frequencies: K band, Ka band, and Ku band.

13. A method of driver amplification, wherein the method comprises the steps of:
arranging a plurality of amplification stages on a die to permit substantially all of an RF signal to flow through said plurality of stages in a zig-zag manner;
supplying a DC bias to said plurality of amplification stages from a centralized DC bias circuitry on a perimeter of said die; and
wherein said plurality of amplification stages comprise at least two FET sections, wherein said at least two FET sections comprise a plurality of FETs and wherein said plurality of FETs are configured to have a shared input and shared output and are configured in a folded FET configuration.

14. The method of claim 13 further comprising the step of forming at least two sections of FET's in a folded amplifier configuration.

15. The method of driver amplification of claim 13, wherein said arranging step further comprises orientating adjacent stages in opposite directions.

16. A driver amplifier comprising:
a plurality of amplification stages arranged on a die to permit an RF signal flow from one stage to the next stage, and wherein said signal flow is characteristic of a zig-zag pattern;
a DC bias circuitry centralized on said die, said circuitry providing a bias feed to each of said amplification stages; and
an interstage matching network comprising said DC bias feed and a DC blocking capacitor.

17. A driver amplifier comprising a plurality of amplification stages, wherein each amplification stage comprises a transistor having an RF signal input and an RF signal output, the amplification stages physically oriented such that successive amplification stages are physically oriented 180 degrees from each other, such that the RF signal input is on a first side in a first amplification stage and on a second side in a second amplification stage, and wherein said second side is physically oriented in the opposite direction of said first side.

18. A driver amplifier comprising a first transistor and a second transistor, wherein said first and second transistors each comprise a RF signal input and a RF signal output, wherein said RF signal input of said first transistor is oriented in a first direction, wherein said second transistor is physically adjacent to said first transistor, wherein said RF signal input of said second transistor is oriented in a second direction, and wherein said second direction is oriented 180 degrees from said first direction.

19. A driver amplifier comprising:

a plurality of transistors;

a driver amplifier input on a first side of a chip, wherein said driver amplifier input is oriented in a first direction;

a driver amplifier output on a second side of said chip, wherein said driver amplifier output is oriented in a second direction, wherein each of said plurality of transistors comprises an RF signal input and an RF signal output, and wherein said RF signal input and RF signal output are oriented in directions that are substantially 90 degrees from said first and second directions.

20. The driver amplifier of claim 19, wherein the orientation of said RF signal input and said RF signal output facilitates flow of a RF signal in a zig-zag path.

* * * * *